United States Patent
Shim et al.

(10) Patent No.: US 7,687,805 B2
(45) Date of Patent: Mar. 30, 2010

(54) METAL WIRING, METHOD OF FORMING THE METAL WIRING, DISPLAY SUBSTRATE HAVING THE METAL WIRING AND METHOD OF MANUFACTURING THE DISPLAY SUBSTRATE

(75) Inventors: Seung-Hwan Shim, Seongnam-si (KR); Ho-Min Kang, Suwon-si (KR); Hoon-Kee Min, Soeul (KR); Sung-Su Hong, Seoul (KR); Sun Park, Suwon-si (KR); Seong-Kweon Heo, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 155 days.

(21) Appl. No.: 11/609,145

(22) Filed: Dec. 11, 2006

(65) Prior Publication Data

US 2007/0148456 A1    Jun. 28, 2007

(30) Foreign Application Priority Data

Dec. 19, 2005  (KR)  ............................. 2005-125219

(51) Int. Cl.
*H01L 27/14* (2006.01)
*H01L 29/04* (2006.01)
*H01L 29/15* (2006.01)
*H01L 31/036* (2006.01)

(52) U.S. Cl. ......................................... 257/59; 257/72
(58) Field of Classification Search ................... 257/59, 257/72
See application file for complete search history.

(56) References Cited

U.S. PATENT DOCUMENTS

| | | | | |
|---|---|---|---|---|
| 5,840,455 | A * | 11/1998 | Ikuno et al. ...................... | 430/67 |
| 6,936,844 | B1 * | 8/2005 | Yamazaki et al. ................ | 257/59 |
| 2004/0245524 | A1 * | 12/2004 | Hirakata et al. ................. | 257/59 |
| 2005/0127367 | A1 * | 6/2005 | Huh et al. ....................... | 257/72 |

* cited by examiner

*Primary Examiner*—Bradley K Smith
*Assistant Examiner*—Alexander Belousov
(74) *Attorney, Agent, or Firm*—F. Chau & Associates, LLC

(57) ABSTRACT

In a metal wiring, a method of forming the metal wiring, a display substrate having the metal wiring and a method of manufacturing the display substrate, the metal wiring includes a metal film and a first amorphous carbon film. The metal film is formed on a base substrate using a copper-containing material, and the first amorphous carbon film is formed beneath the metal film. A process for forming the metal wiring including the amorphous carbon film may be greatly simplified, and generation of defects in the metal wiring may be prevented or reduced.

10 Claims, 15 Drawing Sheets

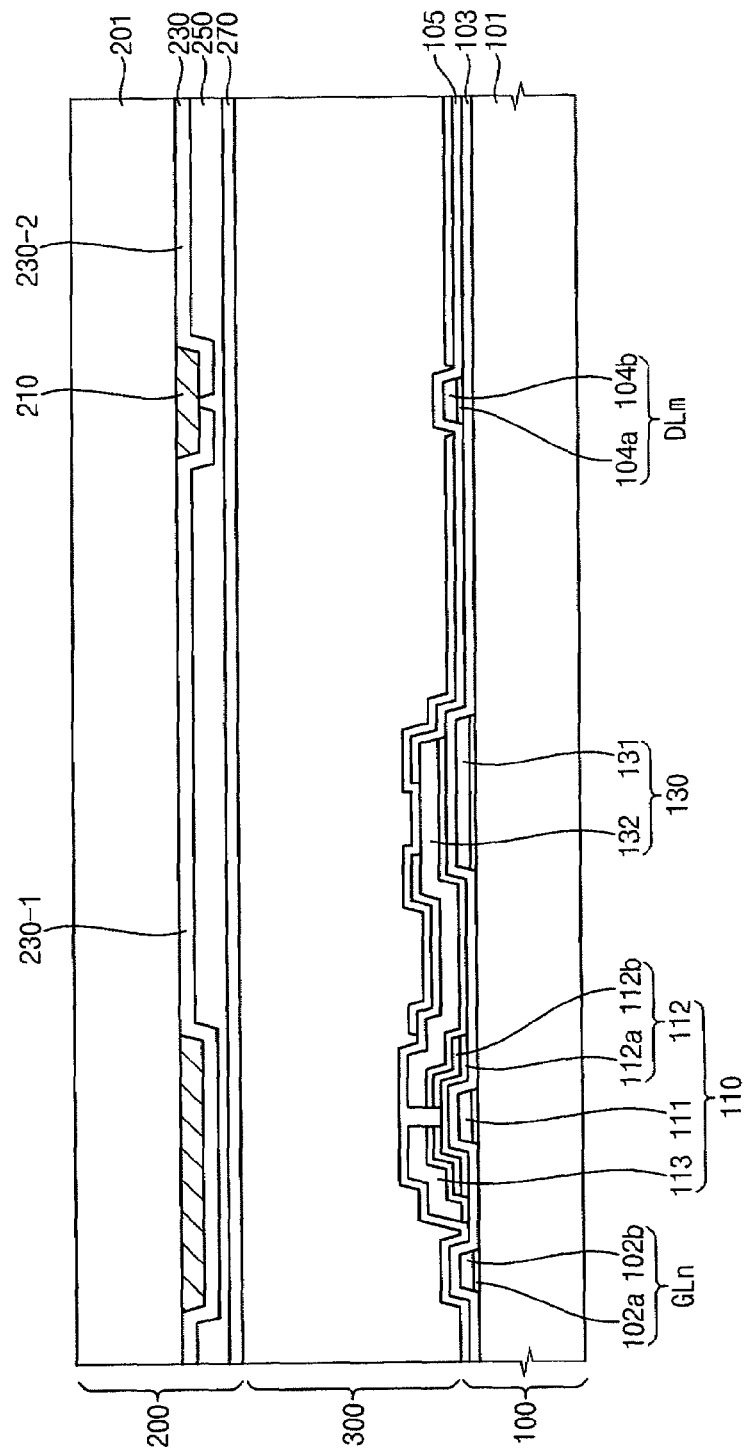

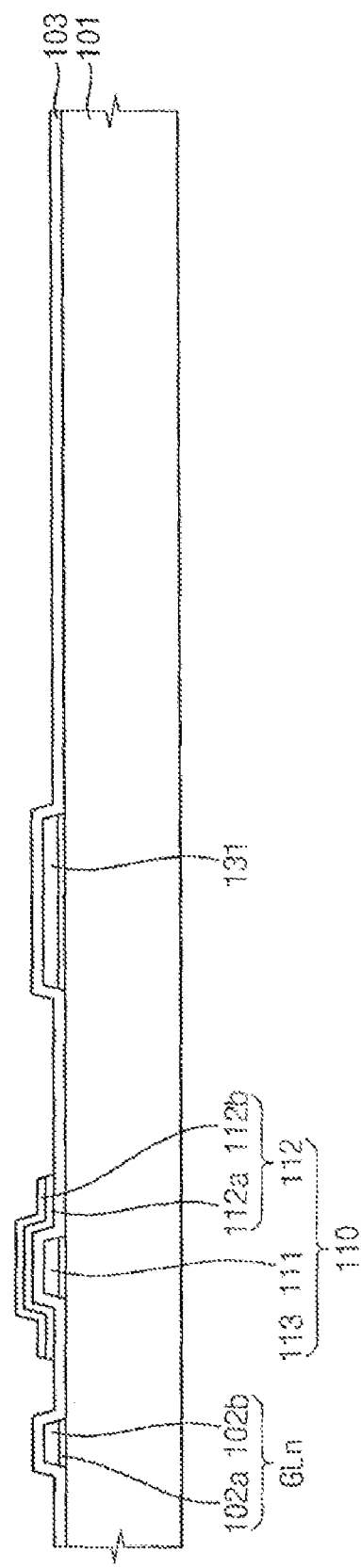

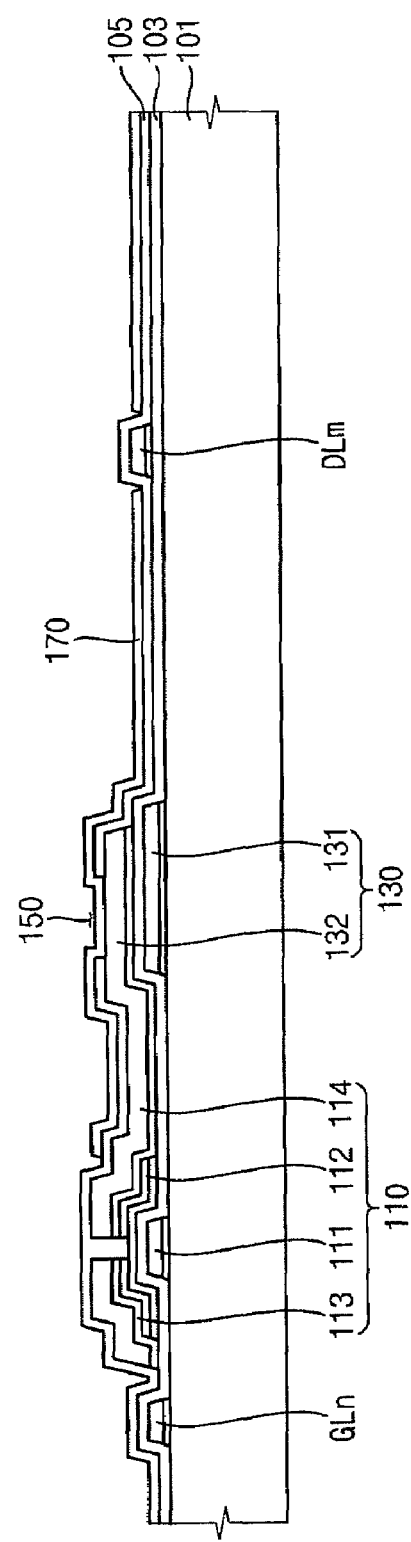

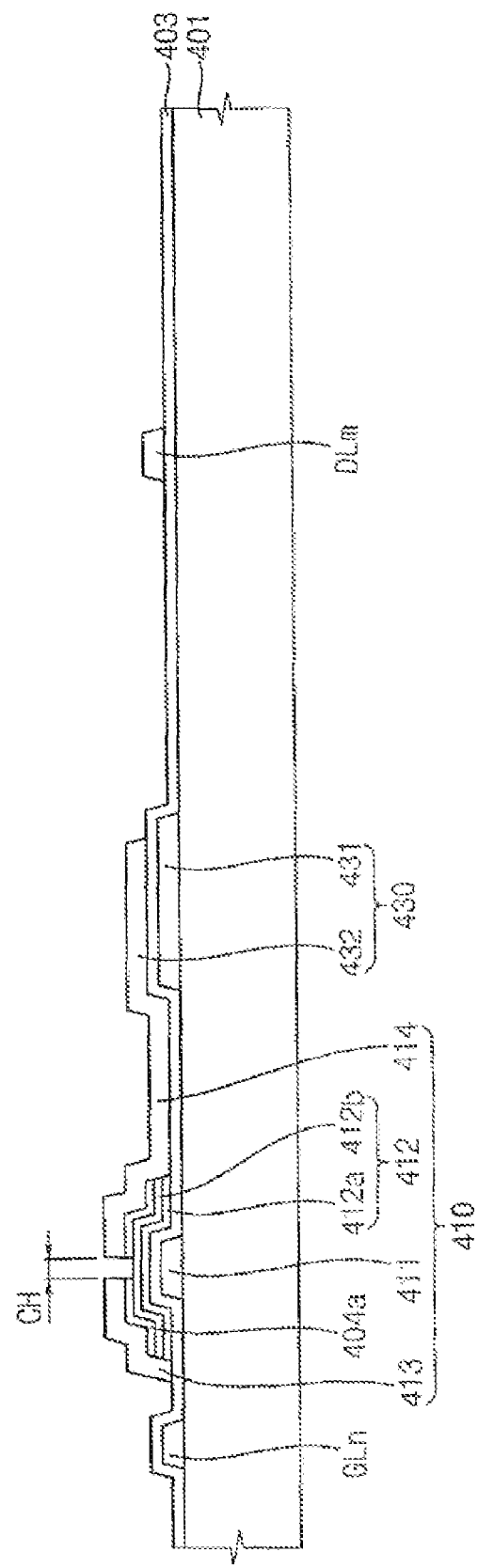

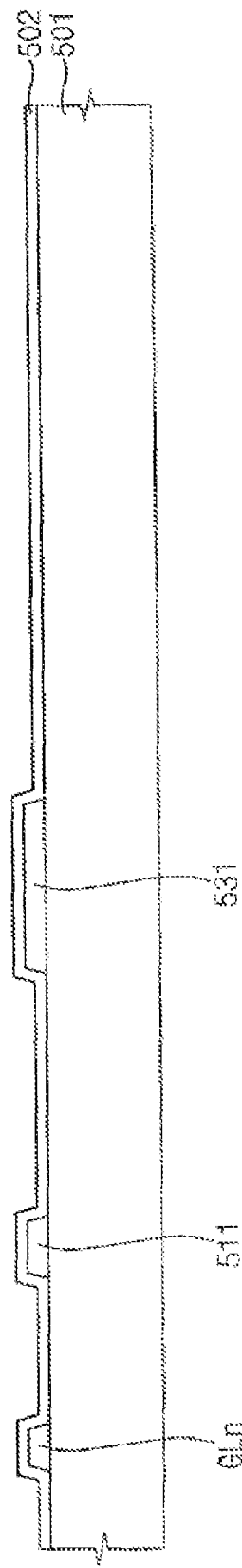

METAL WIRING, METHOD OF FORMING THE METAL WIRING, DISPLAY SUBSTRATE HAVING THE METAL WIRING AND METHOD OF MANUFACTURING THE DISPLAY SUBSTRATE

CROSS-REFERENCE TO RELATED APPLICATION

This application claims priority under 35 U.S.C. §119 to Korean Patent Application No. 2005-125219, filed on Dec. 19, 2005, the contents of which are herein incorporated by reference in their entireties.

BACKGROUND OF THE INVENTION

1. Technical Field

The present disclosure relates to a metal wiring, a method of forming the metal wiring, a display substrate having the metal wiring, and a method of manufacturing the display substrate. More particularly, the present disclosure relates to a metal wiring having reduced defects, a method of forming the metal wiring, a display substrate having the metal wiring, and a method of manufacturing the display substrate.

2. Discussion of the Related Art

A liquid crystal display (LCD) device is widely used in various fields such as an information display or a portable electronic device. The LCD device includes a thin film transistor (TFT) as a switching element that can control an intensity of a transmission light emitted from a pixel to display light and dark gradations.

As the LCD device having a large size and a high resolution is in demand, a metal wiring having a low resistance has been developed. For example, a process for forming a metal wiring using copper that has a very low resistivity has been developed. However, since the copper ion has a strong reactivity with silicon, the metal wiring having copper may be very easily silicidized. The metal wiring having copper has also very poor adhesion characteristics relative to adjacent layers. The above-mentioned problems cause difficulties in using copper wiring as the metal wiring of the LCD device.

To solve the above-mentioned problems, a metal wiring having a double-layered structure or a triple-layered structure that includes a different type of metal film on and/or beneath a copper film, has been developed to prevent diffusion of copper ions and to enhance an adhesion force relative to adjacent layers. However, the metal wiring having the different type of metal film and the copper film may not be uniformly etched due to etching rates that are different for the different metals.

SUMMARY OF THE INVENTION

Exemplary embodiments of the present invention provide a metal wiring that may prevent generation of defects and may be formed by a simple process and a method of forming the above-mentioned metal wiring.

Exemplary embodiments of the present invention provide a display substrate having the above-mentioned metal wiring and a method of manufacturing the above-mentioned display substrate.

According to an exemplary embodiment of the present invention, a metal wiring includes a metal film and a first amorphous carbon film. The metal film is formed on a base substrate using a copper-containing material, and the first amorphous carbon film is formed beneath the metal film.

According to an exemplary embodiment of the present invention, there is provided a method of forming a metal wiring. In the method of forming the metal wiring, a first amorphous carbon film is formed on a base substrate, and a metal film is formed on the first amorphous carbon film using a copper-containing material. The metal film is patterned to form a metal pattern on the first amorphous carbon film.

According to an exemplary embodiment of the present invention, a display substrate includes a gate line, a source line, a switching element and a pixel electrode. The gate line includes a gate metal layer having a first low-resistance metal film, and the source line is intersected with the gate line. The source line includes a source metal layer having an amorphous carbon film and a second low-resistance metal film. The switching element includes a gate electrode extending from the gate line, a source electrode extending from the source line, and a drain electrode having the source metal layer. The pixel electrode is electrically connected to the drain electrode.

According to an exemplary embodiment of the present invention, there is provided a method of manufacturing a display substrate having a plurality of pixels, each of which includes a switching element connected to a gate line and a source line, and a pixel electrode connected to the switching element. In the method of manufacturing the display substrate, a gate metal pattern including the gate line and a gate electrode of the switching element is formed on a base substrate by patterning a gate metal layer. A gate insulation layer is formed on the base substrate having the gate metal pattern. A first amorphous carbon film is formed on the gate insulation layer, and then a low-resistance metal film is partially removed to form a source metal pattern including the source line, a source electrode of the switching element and a drain electrode. A passivation layer is formed on the base substrate having the source metal pattern, and then the pixel electrode electrically connected to the drain electrode is formed on the passivation layer.

According to an exemplary embodiment of the present invention, the low-resistance metal wiring having the amorphous carbon film may be formed by a simple process, and generation of defects in the metal wiring may be prevented.

BRIEF DESCRIPTION OF THE DRAWINGS

Exemplary embodiments of the present invention, can be understood in more detail from the following descriptions taken in conjunction with the accompanying drawings, in which:

FIG. 2 is a cross-sectional view taken along a line I-I' in FIG. 1;

FIGS. 3A to 3E are cross-sectional views illustrating a method of manufacturing the array substrate in FIG. 2 in accordance with an exemplary embodiment of the present invention;

FIGS. 4A to 4D are cross-sectional views illustrating a method of manufacturing the array substrate in FIG. 2 in accordance with an exemplary embodiment of the present invention; and FIGS. 5A to 5D are cross-sectional views illustrating a method of forming the array substrate in FIG. 2 in accordance with an exemplary embodiment of the present invention.

DETAILED DESCRIPTION OF EXEMPLARY EMBODIMENTS

Figure 1:
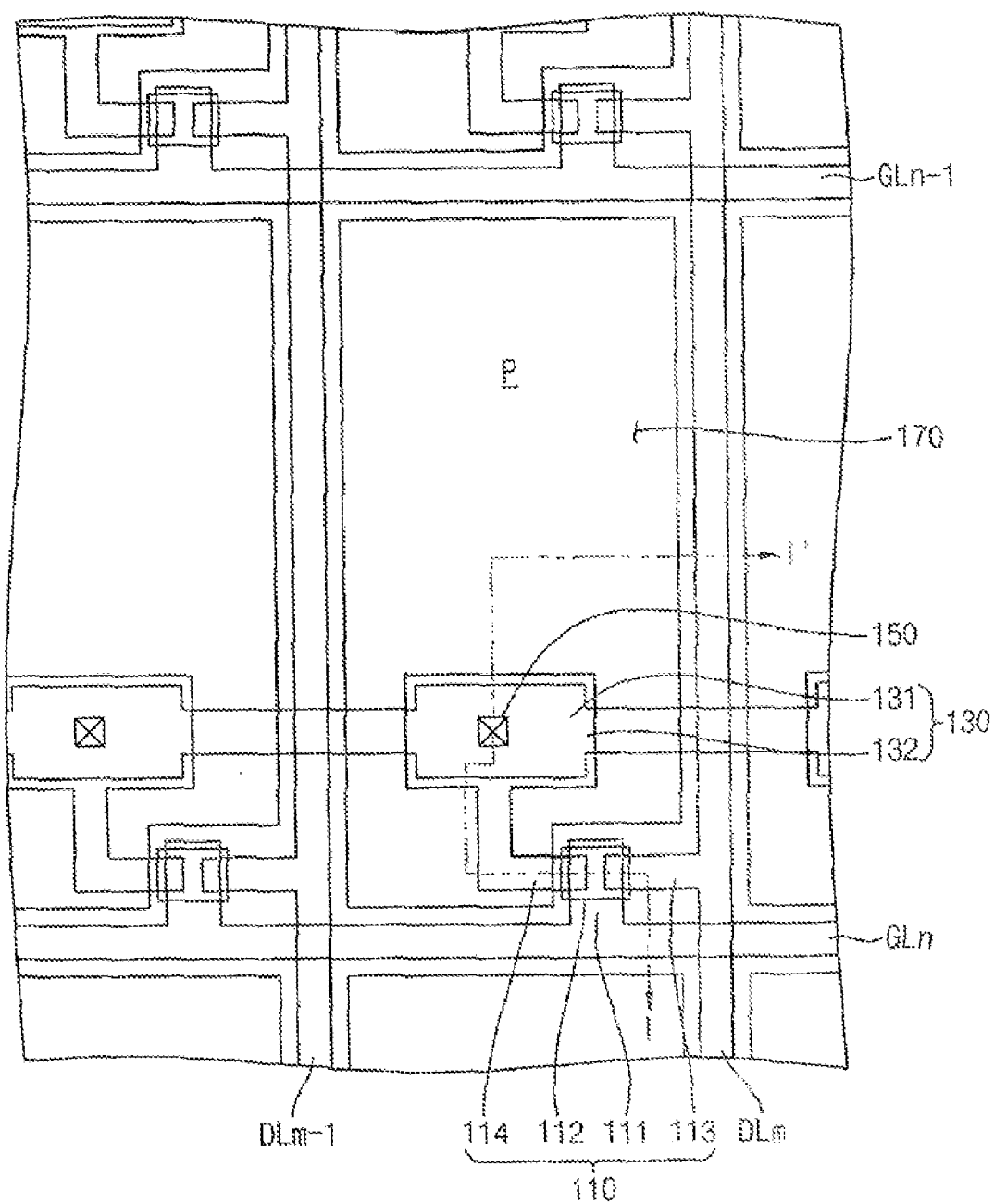
FIG. 1 is a plan view illustrating an array substrate in accordance with an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on,""directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of state features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) or the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view illustrating an array substrate in accordance with an exemplary embodiment of the present invention.

Referring to FIG. 1, the array substrate includes a plurality of gate lines GLn, GLn−1, GLn−2, . . . , and GL1, hereinafter referred to as "GLn" extending along a first direction, a plurality of source lines DLm, DLm−1, DLm−2, . . . , DL1, hereinafter referred to as "DLm", extending along a second direction substantially perpendicular to the first direction, a plurality of pixels P defined by the gate lines GLn and the source lines DLm.

Each of the pixels P includes a switching element 110 such as a thin film transistor (TFT), a storage capacitor 130 connected to the switching element 110 and a pixel electrode 170 provided as an electrode of a liquid crystal capacitor (LCC).

The switching element 110 includes a gate electrode 111 connected to the gate line GLn, a source electrode 113 connected to the source line DLm, and a drain electrode 114 connected to the pixel electrode 170 through a contact hole 150. A channel 112 is formed between the gate electrode 111 and the source and the drain electrode 113, 114.

The storage capacitor 130 includes a first electrode 131 having a metal layer substantially the same as that of the gate line GLn, and a second electrode 132 having a metal layer substantially the same as that of the drain electrode 114. When the switching element 110 is turned off, the storage capacitor 130 may retain a pixel voltage charged in the LCC for one frame time.

The gate line GLn, the gate electrode 111 extending from the gate line GLn, and the first electrode 131 of the storage capacitor 130 are formed by partially removing a gate metal layer. The gate metal layer may include a low-resistance metal film containing a low-resistivity metal such as copper (Cu) or copper alloy. Examples, of a metal in the copper alloy may include aluminum (Al), aluminum alloy, silver (Ag), silver alloy, molybdenum (Mo), molybdenum alloy, chromium (Cr), tantalum (Ta) and/or titanium (Ti), etc.

In an exemplary embodiment of the present invention, the gate metal layer may have a double-layered structure including the low-resistance metal film and the amorphous carbon (a-C:H) film beneath the low-resistance metal film. In an exemplary embodiment of the present invention, the gate metal layer may have a triple-layered structure including the low-resistance metal film and two amorphous carbon films, one beneath and one on the low-resistance metal film.

The amorphous carbon film may enhance adhesion characteristics between the low-resistance metal film and adjacent layers, and prevent a low-resistivity metal ion such as a copper ion from diffusing into adjacent layers. Thus, defects of a metal wiring such as the gate lines GLn, the gate electrode 111 and/or the first electrode 131 of the storage capacitor 130 may be reduced or prevented.

The amorphous carbon film may be formed using a hydrocarbon gas by a plasma enhanced chemical vapor deposition (PECVD) process. Examples of the hydrocarbon gas may include methane, ethane, propane, acetylene, propene or n-butane, etc. These can be used alone or in a mixture thereof.

The amorphous carbon film may be very uniformly formed in a large area, and a thickness of the amorphous carbon film may be easily adjusted. In addition, the amorphous carbon film may have high etching selectivity relative to other kinds of layers, and have film characteristics similar to those of a photoresist film. Hence, the amorphous carbon film may be advantageously used for forming the metal wiring so that a process of forming the metal wiring may be simplified and reliability of the process may be improved.

In an exemplary embodiment of the present invention, the amorphous carbon film may be doped with nitrogen ions using nitrogen gas ($N_2$) and/or ammonia ($NH_3$). The amorphous carbon film doped with the nitrogen ions (a-C:H (N)) may have a resistance lower by a factor of several tens than the resistance of undoped amorphous carbon film. The resistance of the amorphous carbon film may be easily controlled by changing a doping amount of the nitrogen ions. Thus, the amorphous carbon film doped with nitrogen ions may greatly enhance the low resistance characteristics of the metal wiring.

The source line DLm, the source electrode 113 extending from the source line DLm, the drain electrode 114 and the second electrode 132 of the storage capacitor 130 may be formed by partially removing a source metal layer.

The source metal layer may include a low-resistance metal film containing a low-resistivity metal such as copper or copper alloy, and an amorphous carbon film. Examples of a metal in the copper alloy may include aluminum (Al), aluminum alloy, silver (Ag), silver alloy, molybdenum (Mo), molybdenum alloy, chromium (Cr), tantalum (Ta) and/or titanium (Ti), etc.

In an exemplary embodiment of the present invention, the source metal layer may have a double-layered structure or a triple-layered structure that includes the low-resistance metal film and the amorphous carbon film. The amorphous carbon film may enhance adhesion characteristics between the low-resistance metal film and adjacent layers, and prevent a low-resistivity metal ion such as a copper ion from diffusing into adjacent layers.

Particularly, the amorphous carbon film may enhance an adhesion force to the channel 112 having amorphous silicon formed beneath the source metal layer, and prevent a metal ion in the source metal layer from diffusing into the channel 112. Furthermore, when the amorphous carbon film is formed on the low-resistance metal film, the amorphous carbon film may enhance an adhesion force to a passivation layer having silicon nitride formed on the source metal layer.

As a result, defects of the source lines DLm, the source electrode 113, the drain electrode 114 and the second electrode 132 of the storage capacitor 130 may be prevented or reduced.

FIG. 2 is a cross-sectional view taken along a line I-I' in FIG. 1.

Referring to FIGS. 1 and 2, a display panel includes the array substrate 100, a color filter substrate 200 and a liquid crystal layer 300 interposed between the array substrate 100 and the color filter substrate 200.

The array substrate 100 includes a first base substrate 101 and a gate metal pattern on the first base substrate 101. The gate metal pattern includes the gate electrode 111 of the switching element 110, the gate lines GLn and the first electrode 131 of the storage capacitor 130. The gate metal pattern is formed on the first base substrate 101 by patterning the gate metal layer.

The gate metal pattern includes a first amorphous carbon film 102a and a first low-resistance metal film 102b formed on the first amorphous carbon film 102a.

the first amorphous carbon film 102a may be formed using a hydrocarbon gas such as methane, ethane, butane, acetylene, propene and/or n-butane by a PECVD process. The first amorphous carbon film 102 may be advantageously doped with nitrogen ions.

A gate insulation layer 103 is formed on the first base substrate 101 having the gate metal pattern. The channel 112 is formed on the gate insulation layer 103. The channel 112 includes an active film 112a having amorphous silicon (a-Si: H), and a resistive contact film 112b having amorphous silicon heavily doped with N+ type ions.

A source metal pattern is formed on the first base substrate 101 having the channel 112 by patterning the source metal layer. The source metal pattern includes the source lines DLm, the source electrode 113 of the switching element 110, the drain electrode 114 and the second electrode 132 of the storage capacitor 130.

The source metal pattern includes a second amorphous carbon film 104a formed on the resistive contact film 112b and the gate insulation layer 103, and a second low-resistance metal film 104b formed on the second amorphous carbon film 104a. The second amorphous carbon film 104a may have good field emission characteristics so that current-voltage characteristics of the switching element 110 may not be deteriorated.

Furthermore, the second amorphous carbon film 104a may enhance an adhesion force between the second low-resistance metal film 104b and the resistive contact film 112b, and prevent a metal ion such as copper ions of the second low-resistance metal film 104b from diffusing into the resistive contact film 112b. As a result, generation of defects of the source metal pattern may be prevented.

The second amorphous carbon (a-C:H) film 104a may be formed using a hydrocarbon gas such as methane, ethane, butane, acetylene, propene and/or n-butane by a PECVD process. The first amorphous carbon film 102 may be advantageously doped with nitrogen ions using nitrogen and ammonia gases.

A passivation layer 105 is formed on the first base substrate 101 having the source metal pattern. The passivation layer 105 includes a contact hole 150 exposing a portion of the drain electrode 114.

The pixel electrode 170 formed on the pixel P is electrically connected to the drain electrode 114 through the contact hole 150.

The color filter substrate 200 includes a second base substrate 201, a light-shielding pattern 210, a color filter layer 230, a coating layer 250 and a common electrode layer 270. The light-shielding pattern 210 is formed on the second base substrate 201 to define an inner space corresponding to the pixel P and to prevent leakage of light.

The color filter layer 230 includes a plurality of color filter patterns 230-1 and 230-2 to fill up the inner space. The color filter layer 230 emits light having a specific color using an incident light. The color filter layer 230 may advantageously include a red filter pattern, a green filter pattern and a blue filter pattern.

The coating layer 250 is formed on the second base substrate 201 having the color filter patterns 230-1 and 230-2 to provide a flat upper face of the color filter substrate 200.

The common electrode layer 270 is formed on the coating layer 250 to face the pixel electrode 170 of the array substrate 100. A common voltage is applied to the common electrode layer 270. As a result, a liquid crystal capacitor (LCC) including the pixel electrode 170 and the common electrode layer 270 is defined.

The liquid crystal layer 300 is interposed between the array substrate 100 and the color filter substrate 200. The liquid crystal layer 300 includes a plurality of liquid crystal molecules. Orientation angles of the liquid crystal molecules are changed by an intensity of the electric field formed between the pixel electrode 170 of the array substrate 100 and the common electrode layer 270 of the color filter substrate 200.

FIGS. 3A to 3E are cross-sectional views illustrating a method of manufacturing the array substrate shown in FIG. 2 in accordance with an exemplary embodiment of the present invention.

Figure 3A:
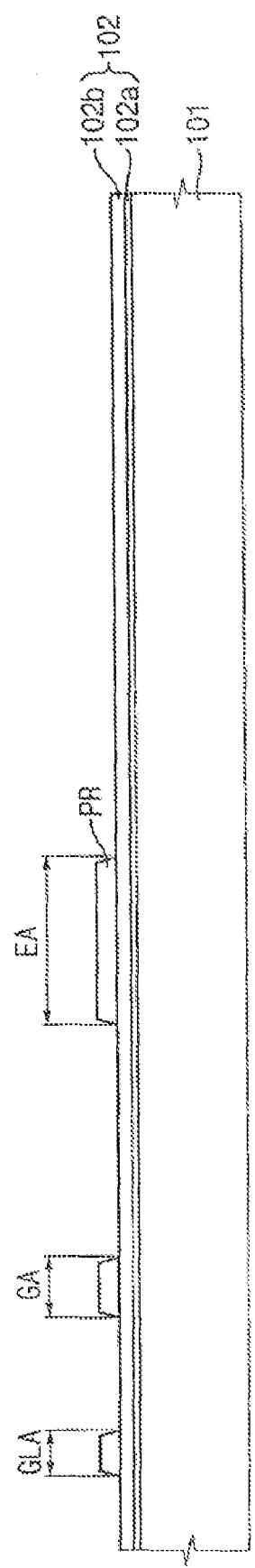

Referring to FIGS. 2 and 3A, a gate metal layer 102 is formed on a base substrate 101. The gate metal layer 102 is patterned to form a gate metal pattern on the base substrate 101. The gate metal pattern includes a gate line GLn, a gate electrode 111 and a first electrode 131 of a storage capacitor 130.

The gate metal layer 102 includes a first amorphous carbon film 102a and a first low-resistance metal film 102b.

Particularly, the first amorphous carbon film 102a may be formed on the base substrate 101 using a hydrocarbon gas such as methane, ethane, propane, butane, acetylene, propene, and/or n-butane, etc. by PECVD process.

In an exemplary embodiment of the present invention, the first amorphous carbon film 102a may be advantageously doped with nitrogen ions using nitrogen gas and/or ammonia. Amorphous carbon doped with nitrogen ions (a-C:H(N)) may have a resistance several tens of times lower than that of undoped amorphous carbon (a-C:H). Thus, the amorphous carbon film doped with nitrogen ions may greatly reduce the resistance of a metal wiring.

The first amorphous carbon film 102a may have a thickness of about 100 Å to about 500 Å. The first low-resistance metal film 102b is formed on the base substrate 101 having the first amorphous carbon film 102a. For example, the first low-resistance metal film 102b may be formed using copper or a copper alloy by a sputtering process.

A photoresist film is formed on the base substrate 101 having the gate metal layer 102, and patterned to form a photoresist pattern (PR) on the gate metal layer 102. The photoresist pattern is formed over an area for forming the gate metal pattern, that is, a gate line area GLA, a gate electrode area GA and a first electrode area EA of the storage capacitor.

The first low-resistance metal film 102b is partially removed from the base substrate 101 using the photoresist pattern as an etching mask. The photoresist pattern is then removed using oxygen plasma. While the photoresist pattern is removed, a portion of the first amorphous carbon film 102a exposed by removal of the first low-resistance metal film 102b may be simultaneously removed from the base substrate 101, because the first amorphous carbon film 102a may have film characteristics similar to those of the photoresist pattern. Thus, an additional process for removing the first amorphous carbon film 102a may not be needed.

As a result, the gate metal pattern is formed on the base substrate 101 by patterning the first low-resistance metal film 102b and the first amorphous carbon film 102a, and by removing the photoresist pattern from the base substrate 101.

The gate metal pattern includes the first amorphous carbon film 102a beneath the first low-resistance metal film 102b so that an adhesion force between the first low-resistance metal film 102b and the base substrate 101 may be enhanced. Thus, generation of defects in a metal wiring, such as the gate metal pattern, may be prevented.

Referring to FIGS. 2 and 3B, a gate insulation layer 103 is formed on the base substrate 101 having the gate metal pattern. For example, the gate insulation layer 103 may be formed using silicon nitride by a PECVD process. The gate insulation layer 103 may have a thickness of about 4,000 Å.

An active film 112a is formed on the base substrate 101 having the gate insulation layer 103, and a resistive contact film 112b is formed on the active film 112a. The active film 112a may be formed using amorphous silicon (a-Si:H) by a PECVD process, and the resistive contact film 112b may be formed using amorphous silicon heavily doped with N+ type ions by a PECVD process.

An additional photoresist pattern (not shown) is formed on the base substrate 101 having the resistive contact film 112b. The resistive contact film 112b and the active film 112a are successively patterned using the photoresist pattern as an etching mask to form a channel 112 of a switching element 110 on the base substrate 101 having the gate insulation layer 103.

Figure 3C:
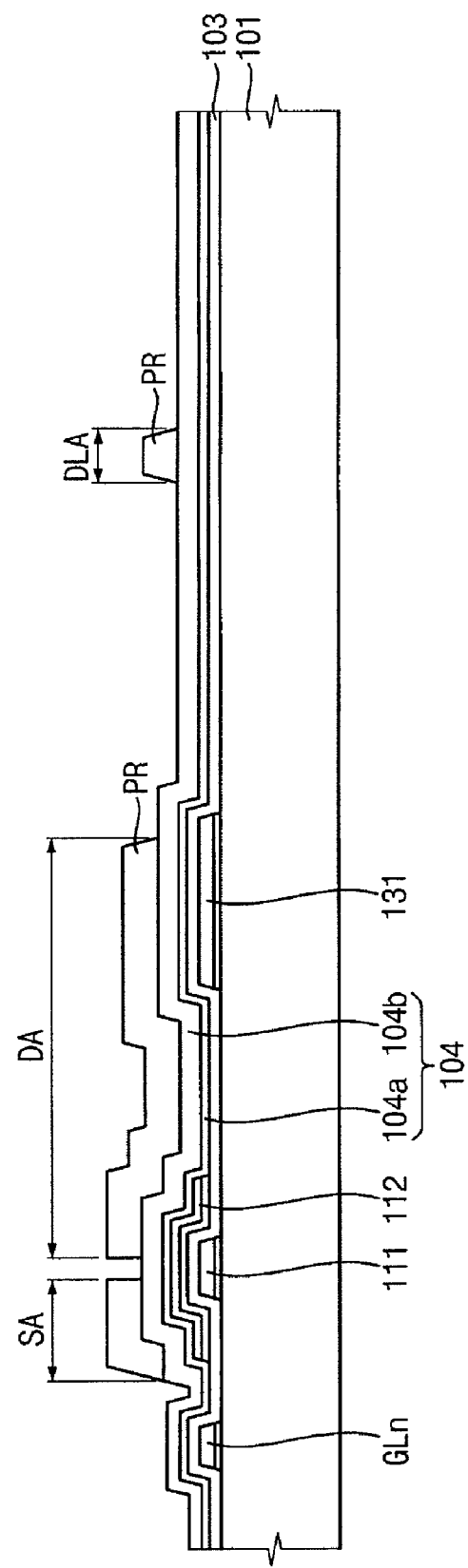
Figure 3D:
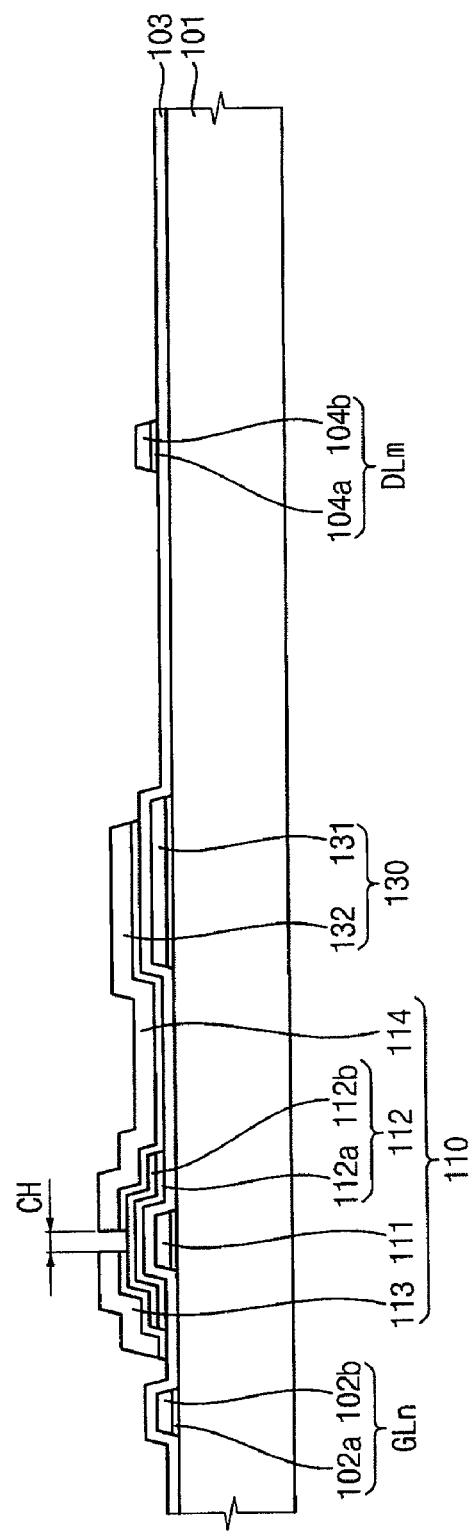

Referring to FIGS. 2, 3C and 3D, a source metal layer 104 is formed on the base substrate 101 having the channel 112. The source metal layer 104 is patterned to form the source metal pattern on the base substrate 101. The source metal pattern includes a source line DLm, a source electrode 113, a drain electrode 114 and a second electrode 132 of the storage capacitor 130.

The source metal layer 104 includes the second amorphous carbon film 104a and the second low-resistance metal film 104b.

A second amorphous carbon film 104a having a thickness of about 100 Å to about 500 Å may be formed by a PECVD process. A second low-resistance metal film 104b may be formed on the second amorphous carbon film 104a by a sputtering process.

The second amorphous carbon film 104a my be formed using a hydrocarbon gas such as methane, ethane, propane, butane, acetylene, propene and/or n-butane, etc. by a PECVD process. The second amorphous carbon film 104a may be advantageously doped with nitrogen ions. Amorphous carbon doped with nitrogen ions (a-C:H(N)) may have a resistance several tens of times lower than the resistance of the undoped amorphous carbon (a-C:H). Thus, the amorphous carbon film doped with nitrogen ions may greatly reduce the resistance of a metal wiring.

The second low-resistance metal film 104b is formed on the base substrate 101 having the second amorphous carbon film 104a. For example, the second low-resistance metal film 104b may be formed using copper or a copper alloy by a sputtering process.

A photoresist film is formed on the base substrate 101 having the source metal layer 104, and patterned to form a photoresist pattern (PR) on the source metal layer 104. The photoresist pattern is formed over an area for forming the source metal pattern. That is, the photoresist film is formed over a source line area DLA, a source electrode area SA and a drain electrode area DA. The drain electrode area DA includes a second electrode area of the storage capacitor 130.

The second low-resistance metal film 104b is patterned using the photoresist pattern. The photoresist pattern is then removed using oxygen plasma. While the photoresist pattern is removed, a portion of the second amorphous carbon film 104a exposed by removal of the second low-resistance metal film 104b may be simultaneously removed from the base substrate 101. In addition, a portion of the second amorphous carbon film 104a exposed in a channel area CH of the switching element 110 is also removed from the base substrate 101. The second amorphous carbon film 104a may have film characteristics similar to those of the photoresist pattern. Thus, an additional process for removing the second amorphous carbon film 104a may not be needed.

The second amorphous carbon film 104a makes contact with the resistive contact film 112b to enhance an adhesion force between the source and the drain electrodes 113 and 114 and the resistive contact film 112b. The second amorphous carbon film 104a may also prevent copper ions of the second low-resistance metal film 104b from diffusing into the resistive contact film 112b. Thus, reaction of copper ions of the second low-resistance metal film 104b with silicon ions of the channel 112 may be prevented. Thus, generation of defects in a metal wiring, such as the source metal pattern, may be prevented.

Referring to FIGS. 2 and 3E, a portion of the resistive contact film 112b exposed between the source and drain electrodes 113, 114 is removed to complete the channel 112 of the switching element 110.

A passivation layer 105 is formed on the base substrate 101 having the source metal pattern. The passivation layer 105 may be formed using an insulation material such as silicon nitride by a PECVE process. The passivation layer 105 may have a thickness of about 1000 Å.

A contact hole 150 is formed through the passivation layer 105 to expose a portion of the drain electrode 114. A pixel electrode 170 is formed on the base substrate 101 having the contact hole 150. The pixel electrode 170 is formed by depositing a transparent and conductive material on the base substrate 101, and by patterning the transparent and conductive film. Examples of the transparent and conductive material may include indium tin oxide (ITO), indium zinc oxide (IZO) and/or indium tin zinc oxide, etc. The pixel electrode 170 is electrically connected to the drain electrode 114 through the contact hole 150. When the switching element 110 is turned on, a pixel voltage is applied to the pixel electrode 170.

Examples of a metal wiring including the amorphous carbon film and the low-resistance metal film may include the gate metal pattern and the source metal pattern, as described above. However, the amorphous carbon film may have strong adhesiveness to a silicon-based material and prevent diffusion of copper ions, so that the amorphous carbon film and the low-resistance metal film may be advantageously used for forming the source metal pattern. Furthermore, although the metal wiring having a double-layered structure that includes the amorphous carbon film and the low-resistance metal film formed on the amorphous carbon film is described above, the metal wiring may have a triple-layered structure including two amorphous carbon films formed on and beneath the low-resistance metal film, respectively.

FIGS. 4A to 4D are cross-sectional views illustrating a method of manufacturing the array substrate in FIG. 2 in accordance with an exemplary embodiment of the present invention.

Figure 4A:
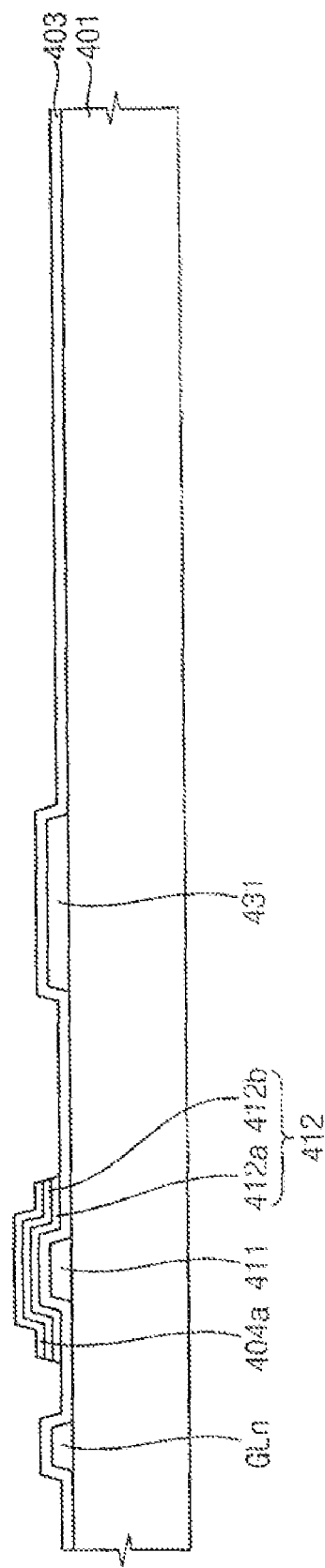

Referring to FIG. 4A, a gate metal layer is formed on a base substrate 401, and patterned to form a gate metal pattern on the base substrate 401. For example, the gate metal layer may be formed using copper or a copper alloy by a sputtering process. The gate metal pattern includes a gate line GLn, a gate electrode 411 and a first electrode 431 of a storage capacitor. The gate metal layer may have a double-layered structure or a triple-layered structure, which includes a low-resistance metal film and at least one amorphous carbon film, as described above with reference to FIG. 3A.

A gate insulation layer 403 is formed on the base substrate 401 having the gate metal pattern. The gate insulation layer may be formed using an insulation material such as silicon nitride by a PECVD process.

An active film 412a, a resistive contact film 412b and an amorphous carbon film 404a are successively formed on the gate insulation layer 403. The active film 412a may be formed using amorphous silicon (a-Si:H) by a PECVD process, and the resistive contact film 412b may be formed using amorphous silicon heavily doped with N+ type ions by a PECVD process. The amorphous carbon film 404a may have a thickness of about 100 Å to about 500 Å.

The amorphous carbon film 404a may be formed using a hydrocarbon gas such as methane, ethane, propane, butane, acetylene, propene and/or n-butane, etc. by a PECVD process. The amorphous carbon film 404a may be advantageously doped with nitrogen ions so as to improve low-resistance characteristics.

A photoresist pattern (not shown) is formed on the base substrate 401 having the amorphous carbon film 404a. The active film 412a, the resistive contact film 412b and the amorphous carbon film 404a are partially removed to form a channel 412 of a switching element 410. The active film 412a, the resistive contact film 412b and the amorphous carbon film 404a may be simultaneously etched using oxygen plasma.

Figure 4B:
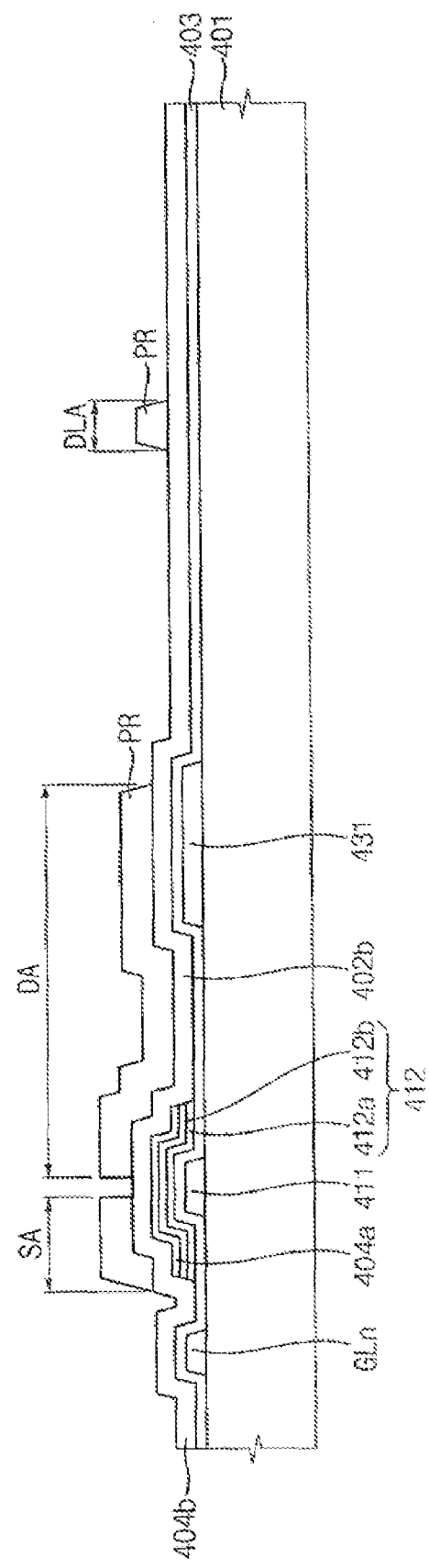

Referring to FIGS. 4B and 4C, a source metal layer 404b is formed on the base substrate 401 having the channel 412, and then patterned to form a source metal pattern. For example, the source metal layer 404b may be formed using copper or a copper alloy. The metal pattern includes a source line DLm, a source electrode 412, a drain electrode 414 and a second electrode 432 of a storage capacitor 430.

Particularly, a photoresist film is formed on the base substrate having the source metal layer 404b, and patterned to form a photoresist pattern on an area for forming the source metal pattern. That is, the photoresist pattern is formed on a source line area DLA, a source electrode area SA and a drain electrode area DA including a second electrode area of the storage capacitor.

The source metal layer 404b is patterned using the photoresist pattern. The photoresist pattern is then removed using oxygen plasma. While the photoresist pattern is removed, a portion of the amorphous carbon film 404a exposed by removal of the source metal layer 404b may be simultaneously removed, because the amorphous carbon film 404a may have film characteristics similar to those of the photoresist pattern. Thus, an additional process for removing the amorphous carbon film 404a may not be required.

In addition, a portion of the amorphous carbon film 404a exposed in a channel area CH of the switching element 410 is also removed from the base substrate 401 to expose the resistive contact film 412b of the channel 412.

Referring to FIG. 4C, a portion of the resistive contact film 412b exposed between the source and the drain electrodes 413 and 414 is removed from the base substrate 401 to complete the switching element 410.

The amorphous carbon film 404a formed beneath the source and the drain electrodes 413 and 414 makes contact with the resistive contact film 412b to enhance an adhesion force between the source and the drain electrodes 413 and 414 and the resistive contact film 412b. Furthermore, the amorphous carbon film 404a may prevent copper ions of the source and the drain electrodes 413 and 414 from diffusing into the resistive contact film 412b.

As a result, reaction of copper ions of the source and the drain electrodes 413 and 414 with silicon ions of the channel 412 may be prevented. Thus, generation of defects in a metal wiring, such as the source metal pattern, may be prevented or reduced.

Figure 4D:
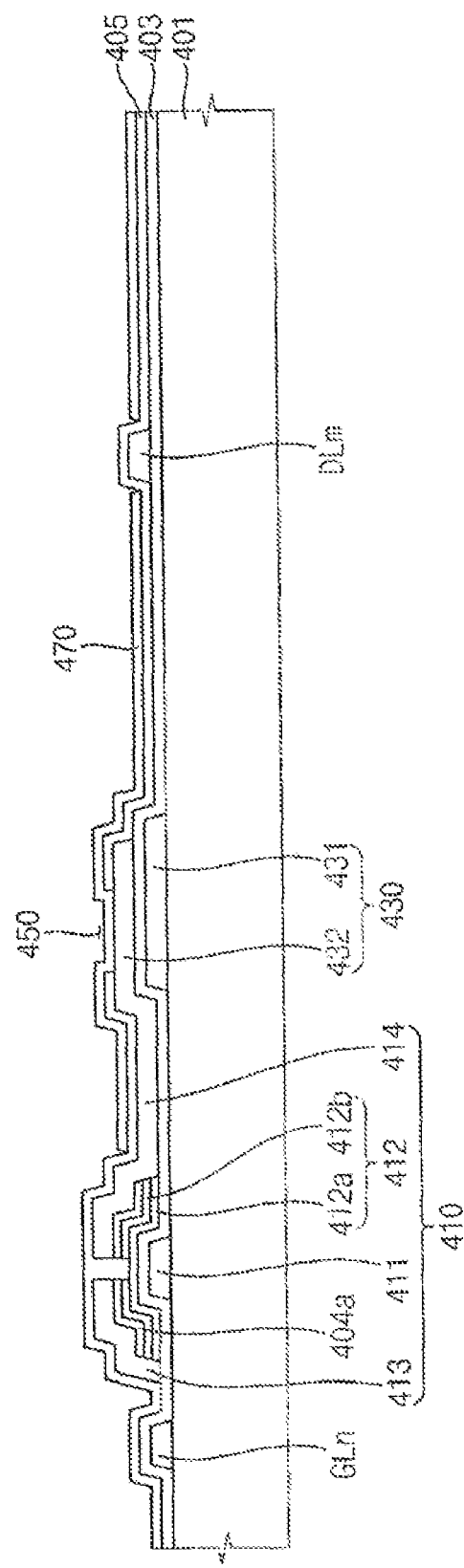

Referring to FIG. 4D, a passivation layer 405 is formed on the base substrate 401 having the source metal pattern using an insulation material such as silicon nitride. A contact hole 450 is formed through the passivation layer 405 to expose a portion of the drain electrode 414. A pixel electrode 470 is formed on the base substrate having the contact hole 450 using a transparent and conductive material. The pixel electrode 470 is electrically connected to the drain electrode 414 through the contact hole 450.

As described above, the amorphous carbon film may be formed only beneath portions of the source and the drain electrodes 413 and 414 that make contact with the channel 412 of the switching element 410. Alternatively, the gate metal layer and the source metal layer may have a double-layered structure or a triple-layered structure including at least one amorphous carbon film.

FIGS. 5A to 5D are cross sectional views illustrating a method of forming the array substrate in FIG. 2 in accordance with an exemplary embodiment of the present invention.

Referring to FIG. 5A, a gate metal layer is formed on a base substrate 501, and then patterned to form a gate metal pattern. For example, the gate metal layer may be formed using copper or copper alloy by a sputtering process. The gate metal pattern includes a gate line GLn, a gate electrode 511 and a first electrode 531 or a storage capacitor. Alternatively, the gate metal layer may have a double-layered structure including an amorphous carbon film and a low-resistance metal film, as described with reference to FIG. 3A.

Figure 5B:
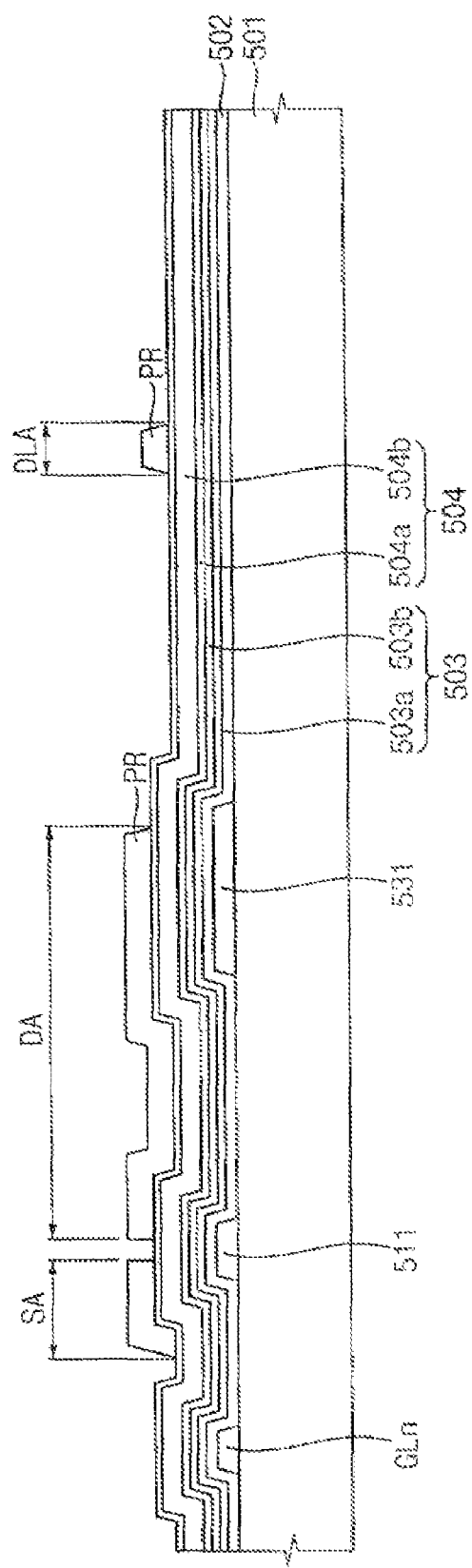

Referring to FIG. 5B, a gate insulation layer 502 is formed on the base substrate 501 having the gate metal pattern. The gate insulation layer 502 may be formed using an insulation material such as silicon nitride by a PECVD process.

An active film 503a, a resistive contact film 503b, a first amorphous carbon film 504a, a low-resistance metal film 504b and a second amorphous carbon film 504c are successively formed on the gate insulation layer 502. The active film 503a may be formed using amorphous silicon (a-Si:H), and the resistive contact film 503b may be formed using amorphous silicon heavily doped with N+ type ions. The low-resistance metal film 504b may be formed using copper or copper alloy. The first and the second amorphous carbon films 504a and 504c may have a thickness of about 100 Å to about 500 Å.

The first and the second amorphous carbon films 504a and 504c may be formed using a hydrocarbon gas such as methane, ethane, butane, acetylene, propene and/or n-butane by a PECVD process. The first and the second amorphous carbon films 504a and 504c may be advantageously doped with nitrogen ions using nitrogen gas and/or ammonia.

The active film 503a and the resistive contact film 503b may serve as a channel layer 503 for forming a channel of a switching element, and the first and the second amorphous carbon films 504a and 504c and the low-resistance metal film 504b may serve as a source metal layer 504 for forming a source metal pattern. The source metal pattern includes a source line, a source electrode, a drain electrode and a second electrode of the storage capacitor.

A photoresist film is formed on the base substrate 501 having the second amorphous carbon film 504c, and then patterned to form a photoresist pattern on an area for forming the source metal pattern. That is, the photoresist pattern is formed on a source line area DLA, a source electrode area SA and a drain electrode area DA including a second electrode area of the storage capacitor.

The source metal layer 504 is patterned using the photoresist pattern by a wet etching process. The channel layer 503 is then patterned by a dry etching process. As a result, the source metal pattern is formed on the base substrate 501.

Figure 5C:
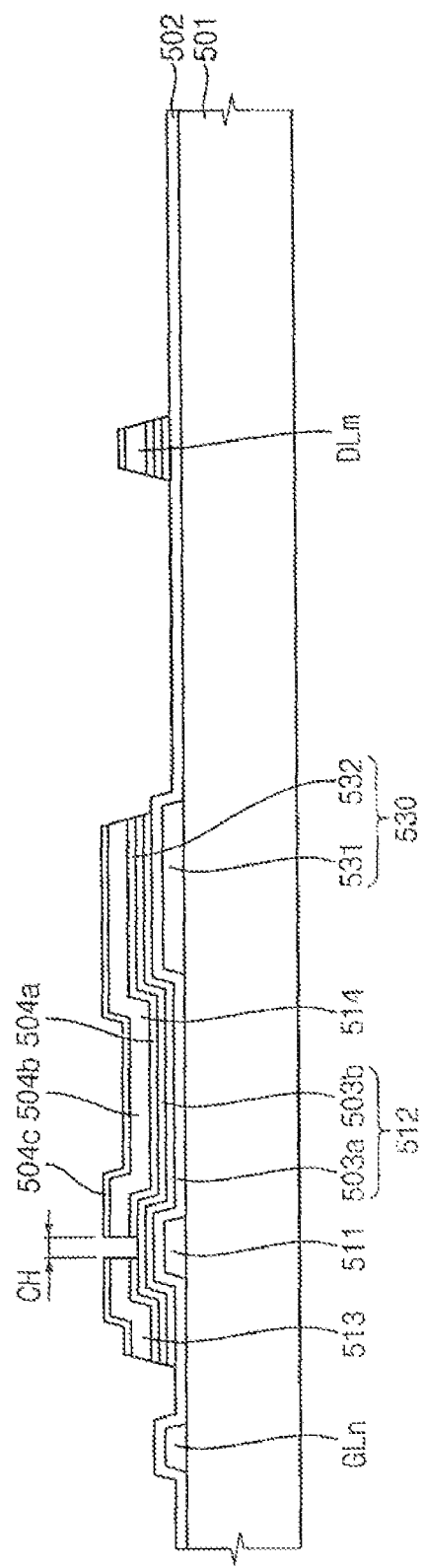

Referring to FIG. 5C, the source metal layer 504 and the channel layer 503 are patterned to form the source metal pattern on the base substrate 501. The source metal pattern includes a source line DLm, a source electrode 513, a drain electrode 514 and a second electrode 532 of the storage capacitor 530. The second amorphous carbon film 504c and the low-resistance carbon film 504b are also patterned to expose the first amorphous carbon film 504a of a channel area CH defined between the source and the drain electrodes 513 and 514. The first amorphous carbon film 504a exposed in the channel area CH may be simultaneously removed from the base substrate 501 while the photoresist pattern is removed using oxygen plasma.

Figure 5D:
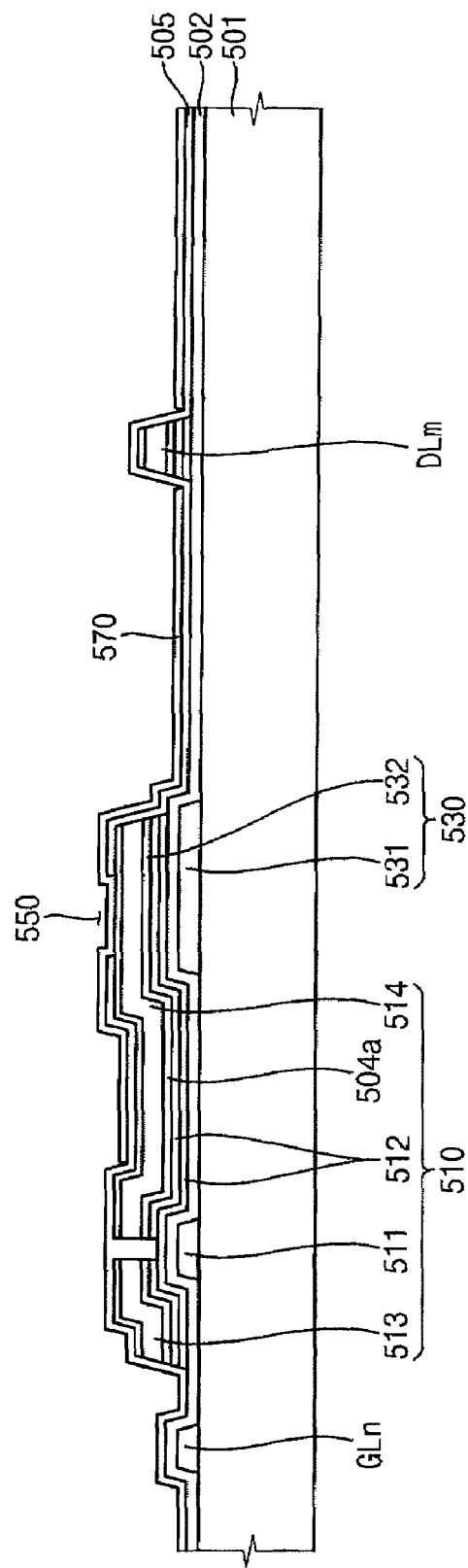

Referring to FIG. 5D, the first amorphous carbon film 504a of the channel area CH is removed to expose the resistive contact film 503b of a channel 512. The resistive contact film 503b is removed using the source and the drain electrodes 513 and 514 as a mask to complete the switching element 510.

A passivation layer 505 is formed on the base substrate 501 having the source metal pattern. The passivation layer may be formed using an insulation material such as silicon nitride. A contact hole 550 is formed through the passivation layer 505 to expose a portion of the drain electrode 514.

The contact hole 550 is formed through the passivation layer 505 by a dry etching process. The second amorphous carbon film 504c is then partially removed from the drain electrode 514 using oxygen plasma to expose a portion of the low-resistance metal film 504b of the drain electrode 514.

A pixel electrode 570 is formed on the base substrate 501 having the contact hole 550 by depositing a transparent and conductive material on the base substrate 501 and by patterning a transparent and conductive layer. The pixel electrode 570 is electrically connected to the drain electrode 514 through the contact hole 550.

The first and second amorphous carbon films 504a and 504c formed on and beneath the low-resistance metal film 504b may enhance adhesion characteristics to the resistive contact film 503b formed under the low-resistance metal film 504b, and may prevent diffusion of copper ions into the resistive contact film 503b. In addition, the second amorphous carbon film 504c may enhance adhesion characteristics to the passivation layer 505 formed over the low-resistance metal film 504b.

The gate metal layer may include a double-layered structure including an amorphous carbon film and a low-resistance metal film formed on the amorphous carbon film. Alternatively, the gate metal layer may include a triple-layered structure including a low-resistance metal film and two amorphous carbon films formed on and beneath the low-resistance metal film like the source metal layer 504 in FIG. 5B.

When the gate metal layer has the above-mentioned triple-layer structure, an upper amorphous carbon film of the triple-layered structure may be etched together with the low-resistance metal film to form a gate metal pattern on a base substrate. A lower amorphous carbon film of the triple-layered structure exposed by removal of the low-resistance metal film may be removed while a photoresist pattern is removed from the gate metal pattern.

A gate insulation layer is generally formed on the gate metal pattern using an insulation material such as silicon nitride. Thus, the gate metal layer may advantageously include the upper amorphous carbon film formed on the low-resistance metal film to enhance adhesion characteristics to the gate insulation layer. The upper amorphous carbon film may be simultaneously etched together with the low-resistance metal film in an etching process for forming the gate metal pattern.

According to exemplary embodiments of the present invention, a metal wiring including an amorphous carbon film and a low-resistance metal film may have enhanced adhesion characteristics between the low-resistance metal film and adjacent layers. In addition, the amorphous carbon film may prevent metal ions such as copper ions of the low-resistance metal film from diffusing into adjacent layers. Thus, generation of defects in the metal wiring may be prevented, and reliability of the metal wiring may be improved.

Furthermore, the amorphous carbon film may be very uniformly formed in a large area, and a thickness of the amorphous carbon film may be easily adjusted.

In addition, the amorphous carbon film may have high etching selectivity relative to other kinds of layers, and have film characteristics similar to those of a photoresist film. Thus, the amorphous carbon film may be easily formed on a base substrate, and removed together with the photoresist film without an additional removal process. As a result, the metal wiring may be formed by a simple process.

The foregoing is illustrative exemplary embodiments of the present invention and is not to be construed as limiting thereof. Although exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A metal wiring comprising:
   a metal film formed on a base substrate, the metal film having a copper-containing material; and
   a first amorphous carbon film formed beneath the metal film,
   wherein the first amorphous carbon film has substantially the same pattern as the metal film.

2. The metal wiring of claim 1, wherein the first amorphous carbon film is doped with nitrogen ions.

3. The metal wiring of claim 1, further comprising a second amorphous carbon film formed on the metal film.

4. The metal wiring of claim 3, wherein the second amorphous carbon film is doped with nitrogen ions.

5. A display substrate comprising:
   a gate line including a gate metal layer having a first low-resistance metal film;
   a source line intersected with the gate line, the source line including a source metal layer having an amorphous carbon film and a second low-resistance metal film;
   a switching element including a gate electrode extending from the gate line, a source electrode extending from the source line, and a drain electrode having the source metal layer; and
   a pixel electrode electrically connected to the drain electrode,
   wherein the amorphous carbon film has substantially the same pattern as the second low-resistance metal film.

6. The display substrate of claim 5, wherein the first and the second low-resistance metal films comprise a copper-containing material.

7. The display substrate of claim 5, wherein the source metal layer has a double-layered structure including the amorphous carbon film and the second low-resistance metal film on the amorphous carbon film.

8. The display substrate of claim 5, wherein the source metal layer has a triple-layered structure including a lower amorphous carbon film, the second low-resistance metal film on the lower amorphous carbon film, and an upper amorphous carbon film on the second low-resistance metal film.

9. The display substrate of claim 5, wherein the switching element further comprises a channel having amorphous silicon.

10. The display substrate of claim 5, wherein the amorphous carbon film is doped with nitrogen ions.

* * * * *